United States Patent [19]

Okino

[11] Patent Number: 4,885,608
[45] Date of Patent: Dec. 5, 1989

[54] PICTURE RECORDING APPARATUS

[75] Inventor: Yoshiharu Okino, Kanagawa, Japan

[73] Assignee: Fuji Photo Film Co., Ltd., Kanagawa, Japan

[21] Appl. No.: 236,409

[22] Filed: Aug. 25, 1988

[30] Foreign Application Priority Data

Aug. 25, 1987 [JP] Japan .................. 62-209139

[51] Int. Cl.[4] .......................................... G03B 27/30
[52] U.S. Cl. ................... 355/107; 355/317
[58] Field of Search ............ 355/27, 57, 79, 90, 355/107, 317; 271/3.1, 176, 184, 186, 289, 291, 294, 298, 303, 227, 240, 248, 255, 226, 259, 9; 270/18, 58

[56] References Cited

U.S. PATENT DOCUMENTS

| | | | |
|---|---|---|---|
| 3,182,578 | 5/1965 | Limberger | 355/107 |
| 4,192,609 | 3/1980 | Tani et al. | 355/574 |
| 4,724,469 | 2/1988 | Shimizu et al. | 355/107 |
| 4,745,442 | 5/1988 | Oshikoshi et al. | 355/107 X |
| 4,792,828 | 12/1988 | Ozawa et al. | 355/317 |
| 4,799,084 | 1/1989 | Koike et al. | 355/317 |

Primary Examiner—Richard A. Wintercorn
Attorney, Agent, or Firm—Sughrue, Mion, Zinn, Macpeak & Seas

[57] ABSTRACT

A picture recording apparatus in which two kinds of picture forming materials are accurately superimposed on one another, such as with a predetermined displacement therebetween. The apparatus includes a pair of forward end detector switches disposed along the conveying paths or the respective picture forming materials immediately before a position where the picture forming materials are to be superimposed on one another for detecting respective forward ends of the picture forming materials. A superimposition control device is responsive to a detection signal from one of the pair of forward end detector switches for one of the picture forming materials to stop conveyance of the one picture forming material and which is responsive to a detection signal from the other of the pair of forward end detector switches for the other picture forming material to control re-conveyance of the one picture forming material at a desired timing to effect correct superposition between the two picture forming materials.

6 Claims, 2 Drawing Sheets

PICTURE RECORDING APPARATUS

BACKGROUND OF THE INVENTION

The present invention relates to a picture recording apparatus in which two kinds of picture forming materials are superimposed on one another.

Examples of such a picture recording apparatus include that disclosed in commonly assigned Japanese Patent Application No. 60-287492. That picture recording apparatus uses a photosensitive material constituted by a support coated with photosensitive components including at least photosensitive silver halide, a reducing agent, a compound which can be polymerized (hereinafter referred to as a polymerizable compound) and a color-picture forming substance. At least the polymerizable compound and the color-picture forming substance are enclosed within the same microcapsules. The photosensitive material is exposed with light carrying an image of a picture (hereinafter referred to as "image carrying light") so that a latent image of the picture is formed on the photosensitive material. The photosensitive material is then subjected to development by heat so that the polymerizable compound is polymerized to a high molecular compound to harden the microcapsules in position whereas the latent picture/image is present. Next, the photosensitive material is placed on a picture receiving material having a picture receiving layer to which the color-picture forming matter can be transferred, and the stack of the photosensitive material and the picture receiving material is pressed so that at least a part of the microcapsules in positions where no latent picture exists are ruptured. Thus, the color-picture forming substance is transferred to the picture receiving material so that a picture is formed on the picture receiving material.

Generally, such a photosensitive material as described above is conveyed in the form of a sheet after being exposed with picture-image carrying light, and superimposed on a picture receiving material which is also in the form of a sheet. In the superimposing operation, it is necessary that the photosensitive material and the picture receiving material be slightly displaced relative to each other for separation after picture transfer. On the other hand, it is necessary that the picture receiving material placed on the photosensitive material cover the whole surface of the latter exposed with picture-carrying light. Accordingly, accurate timing is required in the superimposition of the two materials.

In the picture recording apparatus, there are problems, however, in that humidity, temperature variations, foreign matter, or wear due to long usage use may cause a change in the coefficient of friction of the rollers used for conveying the photosensitive material and of picture receiving material, and hence changes in the timing of feeding the picture receiving material into the apparatus from a stack may occur upon variations in the rigidity of the respective picture receiving materials. Such changes may cause a displacement in the position of superimposition of the two materials, resulting in mistakes in separation of the two materials, partly cutting off of pictures, etc.

SUMMARY OF THE INVENTION

It is therefore an object of the present invention to solve the foregoing problems.

It is another object of the present invention to provide a picture recording apparatus in which two kinds of picture forming materials can be accurately superimposed on one another.

In order to attain the above objects, according to the present invention, a picture recording apparatus employing a step of superimposing two kinds of picture forming materials is provided which comprises: a pair of forward end detection means disposed respectively along conveying paths of the picture forming materials immediately before a position where the picture forming materials are superimposed on one another for detecting respective forward ends of the picture forming materials, and superimposition control means responsive to a detection signal from one of the pair of forward end detection means for one of the picture forming materials to stop the conveyance of the one picture forming material and which is responsive to a detection signal from the other of the pair of forward end detection means for the other picture forming material to control re-conveyance of the one picture forming material at a desired timing.

That is, the one picture forming material is caused to stop at the position of the one forward end detection means, and the timing for superimposition of the two picture forming materials is determined at a point of time when the other picture forming material is detected by the other forward end detection means, that is, immediately before the superimposition.

According to the present invention, one of the two kinds of picture forming materials is a photosensitive material. Any photosensitive material can be used so long as it is of a type in which a picture formed on the photosensitive material by exposure can be transferred onto a picture-transfer material, that is, a picture receiving material, so that a visible picture can be obtained on the picture receiving material As an example of such a photosensitive material, a so-called heat-developing photosensitive material is known in which a picture obtained through heat development is transferred by heating to the other picture forming material, that is to the picture receiving material Examples of such a heat-developing photosensitive material include: a material of the type in which movable coloring substances in the form of a picture are released by heating and transferred by means of a solvent such as water or the like to a picture receiving material, that is, a coloring-matter fixing material, having a mordant; a material of the type in which movable coloring substances are transferred to a picture receiving material by means of an organic solvent having a high boiling point; a material of the type in which movable coloring substances are transferred to a picture receiving material by means of a hydrophilic thermal solvent contained in the picture receiving material; and a material of the type in which movable coloring substances having a heat diffusion property or a sublimation property are transferred to a coloring-matter receiving material such as a support or the like. Examples of such heat-developing photosensitive materials are disclosed in U.S. Pat. Nos. 4,463,079, 4,474,867, 4,478,927, 4,507,380, 4,500,626, and 4,483,914, and Japanese Unexamined Patent Publications Nos. 58-149046, 58-149047, 59-152440, 59-154445, 59-165054, 59-180548, 59-168439, 59-174832, 59-174833, 59-174834, and 59-174835.

Further, as another example of the photosensitive material, a so-called photosensitive and pressure-sensitive material is known in which a picture formed by exposure with image carrying light is transferred by pressure onto a picture receiving material having a picture receiving layer to thereby obtain a visible picture. Such materials include a material of the type in which a polymerizable compound is exposed with image carrying light to be hardened corresponding to the image, and then the material is superimposed on a picture receiving material and the stack of the two materials is pressed to thereby obtain a visible picture on the picture receiving material. The photosensitive and pressure-sensitive material is constituted by a support and capsules of macromolecular resin walls carried by the support, each capsule containing a vinyl compound, a photopolymerization initiator, and a colorant precursor.

Further, for the photosensitive material there is known a material of the type in which, after a latent image formed through exposure with image carrying light has been subjected to heat development or wet development, the material is superimposed on a picture receiving material and the stack of the two materials is pressed to thereby obtain a visible picture. An example of such a material is disclosed in commonly assigned Japanese Unexamined Patent Publication No. 61-278849.

This material is of the type in which, after heat development, a color-picture forming substance is transferred onto a picture receiving material having a picture receiving layer to thereby obtain a picture on the picture receiving material. The material is constituted by a support coated with a least photosensitive silver halide, a reducing agent, a polymerizable compound, and a color-picture forming matter. At least the polymerizable compound and the color-picture forming substance are contained in the same microcapsules.

BRIEF DESCRIPTION OF THE DRAWINGS

The present invention will be apparent from the following detailed description taken in conjunction with the accompanying drawings, in which.

DESCRIPTION OF THE PREFERRED EMBODIMENTS

A preferred embodiment of a picture recording apparatus of the present invention will be described with reference to the case where a photosensitive material of the type in which heat development is performed before pressure transfer is performed.

Figure 1:
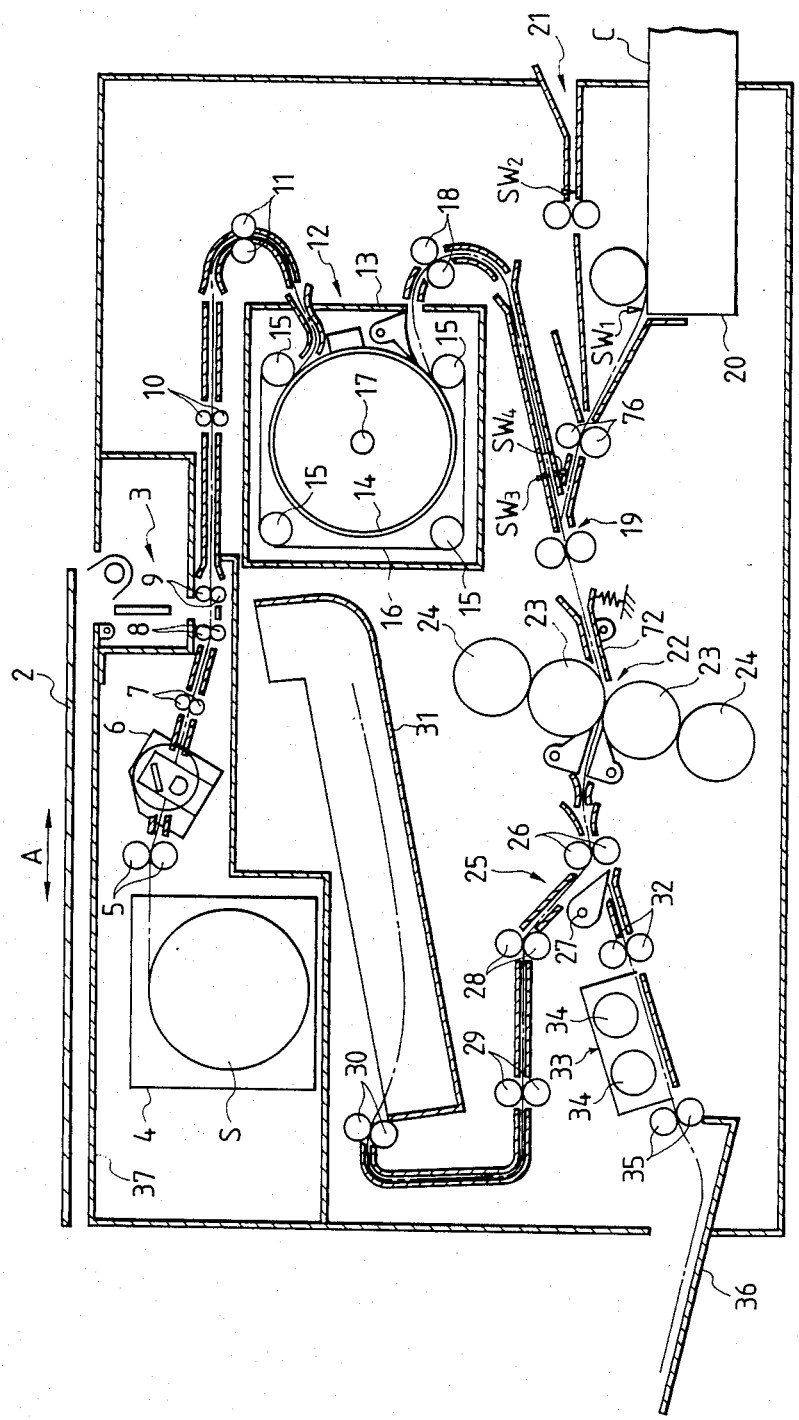
FIG. 1 is a longitudinal sectional view showing an embodiment of a picture recording apparatus constructed according to the present invention.

FIG. 1 is a longitudinal sectional view showing a picture recording apparatus according to the present invention.

A transparent supporting plate 2 made of glass for holing a document thereon is provided on the upper surface of a housing 1, and an exposure device 3 is provided below the glass plate 2. The exposure device 3 is fixed in the housing 1, and glass plate 2 is arranged to be horizontally reciprocated above the exposure device 3 by a drive device (not shown), that is, in the direction of an arrow A in the drawing.

A photosensitive material S is housed in a rolled state in a magazine 4, and drawn out of the magazine 4 by a pair of feed-out rollers 5. Attachment/removal of the magazine 4 is performed after an upper portion cover 37 has been opened by rotation about its right end in the drawing. The photosensitive material S drawn out of the magazine 4 is conveyed to an exposure portion by conveying rollers 7, 8, and 9 and cut to a predetermined length by a cutter 6 while being exposed.

The sheet-like cut photosensitive material S having an exposed image is further conveyed into a heat-developing device 12 by conveying rollers 10 and 11.

The heat-developing device 12 is provided, in a thermally insulated housing 13, with a hollow cylindrical heating roller 14, four belt supporting rollers 15, and an endless belt 16 wound around the outer peripheral surface of the heating roller 14 through an angle of about 240 degrees and entrained so as to engage the supporting rollers 15, so that the photosensitive material S is conveyed while being sandwiched between the belt 16 and the heating roller 14 and while being heated at about 120° C. by a halogen lamp 17 provided in the heating roller 14.

The photosensitive material S heat-developed by the heat-developing device 2 is discharged from the housing 13 and conveyed by conveying rollers 18 to a superimposition portion 19 where the photosensitive material S is superimposed on picture receiving paper C fed from a picture receiving paper cassette 20 or from a manual insertion portion 21. The stack of the photosensitive material S and the picture receiving paper C is conveyed to a pressing-transferring device 22.

The pressing-transferring device 22 is constituted by a pair of pressing rollers 23 urged against each other, backup rollers 24 urged against corresponding pressing rollers 23, and a blade 72 provided at an inlet portion of the pressure-transferring device 22 for preventing the photosensitive materials S and the picture receiving paper C from crinkling. The forward end of the blade 72 contacts elastically with the pressing roller 23. The stack of the photosensitive material S and the picture receiving paper C is pressed by pressure of about 550 kg/cm$^2$. After a picture recorded on the photosensitive material S has been transferred to the picture receiving paper C, the stack of the photosensitive material S and the picture receiving paper C is conveyed to a separation device 25.

The separation device 25 is constituted by conveying rollers 26 and a separating pawl 27, and arranged such that the separation pawl 27 is swung at the downstream side of the conveying rollers 26 in such a manner that the forward end of the separating pawl 27 is inserted between the photosensitive material S and the picture receiving paper C to thereby separate the photosensitive material S and the picture receiving paper C from each other.

The photosensitive material S separated from the picture receiving paper C by the separation device 25 is conveyed and discharged into a discard tray 31 by conveying rollers 28, 29, and 30. After being separated from the photosensitive material S, the picture receiving paper C having the picture transferred thereon is conveyed to a fixing device 33 by conveying rollers 32. After having being irradiated with ultraviolet rays, for example, from ultraviolet lamps 34 provided in the fixing device 33 to fix the picture, the picture receiving paper C is then sent onto a take-out tray 36 by conveying rollers 35.

Figure 2:
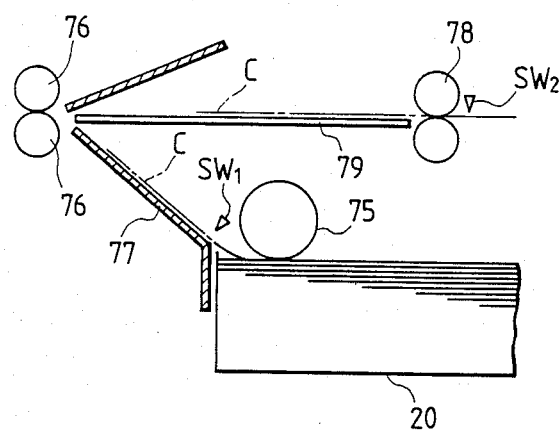
FIG. 2 is a longitudinal sectional view showing a picture receiving paper feed portion.

FIG. 2 is a longitudinal sectional view showing a picture receiving paper feed portion. The picture receiving paper C fed from the picture receiving paper cassette 20 by a feed roller 75 is detected by a sensor $SW_1$, and then held in a stand-by position along a guide plate 77 after being conveyed for a short distance. The picture receiving paper C fed from the manual insertion portion 21 by feed rollers 78 is detected by another sensor $SW_2$, and then held in a stand-by position along a guide plate 79 after being conveyed for a short distance.

Figure 3:
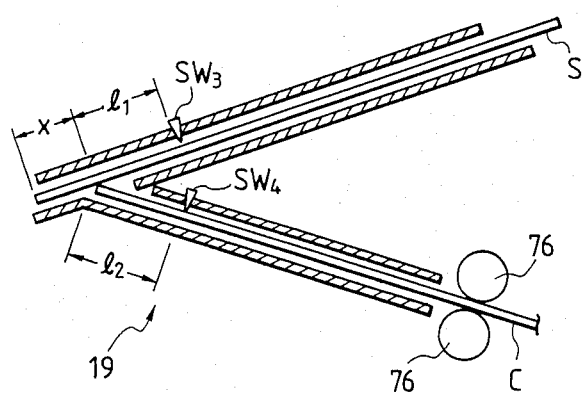
FIG. 3 is a longitudinal sectional view showing a portion where superimposition is executed.

Upon initiation of the picture recording operation, the picture receiving paper C begins to be conveyed from the stand-by position shown in FIG. 2, and is further conveyed while being sandwiched between resist rollers 76. At the moment when the picture receiving paper C is detected by a picture receiving paper sensor $SW_4$ disposed at a position immediately before and separated by a distance $P_2$ from the position of superimposition of the photosensitive material S and the picture receiving paper C as shown in FIG. 3, the resist rollers 76 are stopped by a superimposition controlling device (not shown) so that the picture receiving paper C stops at the position of the sensor $SW_4$. Thus, the forward end of picture receiving paper C stops at the position of the sensor $SW_4$ so that any displacement in conveyance which has occurred thus far can be eliminated.

Next, when the photosensitive material S is detected by a photosensitive material sensor $SW_3$ disposed at a position immediately before and separated by a distance $l_1$ from the position of superimposition of the photosensitive material S and the picture receiving paper C, the driving of the resist rollers 76 is started by the superimposition controlling device with a delay of time of $(l_1+x-l_2)/v$ seconds (x representing a desired distance of displacement between the respective forward ends of the photosensitive material and the picture receiving paper, and v representing the conveying velocity of the photosensitive material and picture receiving paper), corresponding to the timing of superimposition of the photosensitive material S and the picture receiving paper C, which are determined correspondingly to the distances $l_1$ and $l_2$, so that the picture receiving paper C is conveyed again. As a result, it is possible to set the distance between the respective forward ends of the photosensitive material S and the picture receiving paper C to a predetermined value x because no error generation can occur between each of the sensors and the position of superimposition.

In this embodiment of a picture recording apparatus according to the present invention, generally the photosensitive material S is conveyed at the same velocity as the picture receiving paper C, and photosensitive material S is superimposed on the picture receiving paper C with a displacement therebetween controlled in such a manner that the forward end of the former is in advance of that of the latter. Accordingly, the expression $l_1+x \geq l_2$ denotes the relationship among the distances $l_1$ and $l_2$ and the predetermined displacement distance x.

The present invention is not limited to the foregoing embodiment, but is suitably applicable to any other apparatus in which sheet-like materials are to be superimposed one on the other.

As described above, a picture receiving paper is stopped at the position of a sensor provided therefor, whereby errors such as those in the prior art apparatus are prevented, and the respective sensors for the picture receiving paper are disposed immediately before the position of superimposition of the picture receiving paper and the photosensitive material. No errors exist between the position of each of the sensors and the position of superimposition of the picture receiving paper and the photosensitive material. Thus, it is possible to perform processing with high accuracy and to carry out correct superimposition.

What is claimed is:

1. A picture recording apparatus whose operation includes a step of superimposing two kinds of picture forming materials, said picture recording apparatus comprising:
   a pair of forward end detection means disposed respectively along conveying paths of said picture forming materials immediately before a position where said picture forming materials are superimposed on one another for detecting respective forward ends of said picture forming materials; and
   superimposition control means which is responsive to a detection signal from one of said pair of forward end detection means for one of said picture forming materials to stop conveyance of said one picture forming material and which is responsive to a detection signal from the other of said pair of forward end detection means for the other picture forming material to control re-conveyance of said one picture forming material at a desired timing to effect correct superposition between said picture forming materials.

2. The picture recording apparatus of claim 1, wherein one of said picture forming materials comprises a photosensitive material.

3. The picture recording apparatus of claim 1, wherein one of said picture forming materials comprises a heat-developing photosensitive material.

4. The picture recording apparatus of claim 1, wherein one of said picture forming materials comprises a photosensitive and pressure-sensitive material.

5. The picture recording apparatus of claim 1, wherein said detection means comprises a pair of position sensor switches.

6. The picture recording apparatus of claim 1, wherein said picture forming materials are superimposed on one another with a predetermined displacement therebetween.

* * * * *